United States Patent [19]
Gardner et al.

[11] Patent Number: 5,952,696
[45] Date of Patent: Sep. 14, 1999

[54] COMPLEMENTARY METAL OXIDE SEMICONDUCTOR DEVICE WITH SELECTIVE DOPING

[75] Inventors: Mark I. Gardner, Cedar Creek; Daniel Kadosh, Austin, both of Tex.

[73] Assignee: Advanced Micro Devices, Austin, Tex.

[21] Appl. No.: 08/792,196

[22] Filed: Jan. 30, 1997

[51] Int. Cl.⁶ .............................. H01L 29/76; H01L 29/94
[52] U.S. Cl. .......................................... 257/369; 257/371
[58] Field of Search ................................... 257/369, 371, 257/372, 376, 408

[56] References Cited

U.S. PATENT DOCUMENTS

| | | | |
|---|---|---|---|
| 4,104,784 | 8/1978 | Klein | 438/276 |
| 4,280,855 | 7/1981 | Bertin et al. | 438/279 |
| 4,514,894 | 5/1985 | Kawagoe | 438/276 |
| 4,753,897 | 6/1988 | Lund et al. | 438/296 |
| 5,040,035 | 8/1991 | Gabara et al. | 257/288 |
| 5,252,505 | 10/1993 | Yatsuda et al. | 438/286 |
| 5,541,548 | 7/1996 | Crafts | 327/364 |
| 5,633,185 | 5/1997 | Yiu et al. | 438/258 |
| 5,648,286 | 7/1997 | Gardner et al. | 438/286 |
| 5,759,897 | 6/1998 | Kadosh et al. | 438/286 |

OTHER PUBLICATIONS

Mead, C. et al. *Introduction to VLSI Systems,* published by Addison–Wesley Publishing Company, p. 17 (1980).
Wolf, S., *Silicon Processing for the VLSI Era. vol. 2: Process Integration,* published by Lattice Press, pp. 354–361 (1990).

*Primary Examiner*—Wael M. Fahmy
*Attorney, Agent, or Firm*—Merchant, Gould, Smith, Edell, Welter & Schmidt, P.A.

[57] ABSTRACT

A semiconductor device and fabrication thereof is disclosed in which devices are formed on two devices regions of opposite conductivity types by selectively masking and implanting the same type of dopant into active regions of both device regions. The process includes masking part of the active regions in each device region and implanting a dopant into exposed active regions in both devices regions. The number of masking, implantation and other steps required in the fabrication process are reduced by the selective masking of various active regions. Non-symmetrically doped source and drain regions may be formed on the transistors among a group which lie closest to the opposite device region.

17 Claims, 7 Drawing Sheets

COMPLEMENTARY METAL OXIDE SEMICONDUCTOR DEVICE WITH SELECTIVE DOPING

FIELD OF THE INVENTION

The present invention is directed generally to semiconductor devices and to a method of manufacture thereof and, more particularly, to fabrication of complementary metal-oxide semiconductor (CMOS) devices having selectively doped active regions.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs thereof are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by heavily doping the regions with a dopant of a desired conductivity. The conductivity of the doped region depends on the type of impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly doped with a dopant having a conductivity type opposite to that of the source and drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to controls the current flow through the channel region. This type of device is commonly referred to as a MOS field-effect-transistor (MOSFET).

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic). Conversely, the channel of a p-channel MOS (PMOS) device under the transverse electric field is associated with p-type impurities (e.g., boron).

Historically, only one type of device-would be fabricated on a single wafer (i.e., only a single technology such as NMOS or PMOS would be used). As larger numbers of devices were formed on a wafer, increases in power density and dissipation inhibited the ability to use only a single technology. In response, complementary MOS (CMOS) technology was developed using both PMOS and NMOS transistors fabricated in a single substrate. While use of CMOS technology solves a number of problems, the technology is significantly more complex with respect to device physics. Moreover, since different types of dopants are being used, the complexity and cost of the fabrication process are both increased. For example, different masking and implantation steps are typically required to form doped regions for each type of dopant in the substrate.

A number of different techniques and fabrication processes may be used to form CMOS devices. With reference to FIGS. 1A–1E, one typical CMOS fabrication process will be described. The process depicted is used to form semiconductor structures having lightly doped drain (LDD) regions within the source and drain structures. As is well known, LDD structures are used in the formation of semiconductor devices having short channels in order to overcome problems associated therewith.

As depicted in FIG. 1A, a substrate 101 is divided into two device regions 101A and 101B. The two device regions 101A and 101B are of different conductivity types (n-channel and p-channel, respectively, in the illustrated embodiment) and are used to form the CMOS structures thereon. Different techniques may be used to form the two device regions 101A and 101B. The regions may be formed using an n-well in a p-type substrate, a p-well in an n-type substrate, twin wells in either an n- or p-type of substrate, etc. On the surface of the substrate 101, a field oxide, such as $SiO_2$, is generally provided to isolate the surface of the two device regions 101A and 101B. One or more gate electrodes 103 are formed on each of the device regions 101A and 101B. In the illustrated example, one gate electrode 103A is formed on the device region 101A and one gate electrode 103B is formed on the device region 101B.

An LDD region in the n-channel device region is first formed by masking the p-channel device region 101B with a mask layer 105 and implanting a relatively low dose of an n-type dopant 107 into the exposed areas to form lightly doped regions 109 as illustrated in FIG. 1A. A second mask 111 is formed over the n-channel device region 101A and a p-type dopant 113 is implanted into the p-channel device region 101B to form lightly doped p-type regions 115 in the substrate adjacent the gate electrode 103B.

Following the LDD implants, a spacer layer is formed and etched to form spacers 117 on sidewalls of the gate electrodes 103A and 103B. The p-channel device region 101B is again masked with a mask layer 119 and a heavy dose of an n-type dopant 121 is implanted into the substrate aligned with the spacers 117A as illustrated in FIG. 1C. In this manner, LDD structures 123A are formed in the substrate as illustrated in FIG. 1C.

In a manner similar to the n-channel region, the p-channel device region 101B is then exposed while masking the n-channel device region 101A with a mask layer 125. A high dose of a p-type dopant 118 is implanted into the substrate using spacers 117B for alignment. In this manner, LDD structures 127B are also formed in the p-channel device region 101B.

Following formation of the LDD structures, the mask 125 are typically removed and further processing such as silicidation and interconnect formation is performed. The resulting structure is depicted in FIG. 1E. As will be appreciated, a relatively large number of steps must be performed to form the two CMOS transistors as compared to formation of two transistors using the same technology (e.g., NMOS only). This increases the costs associated with circuit fabrication.

SUMMARY OF THE INVENTION

Generally, the present invention relates to a semiconductor device and fabrication process in which devices are formed on two devices regions of opposite conductivity types by selectively masking and implanting the same type of dopant into active regions of both device regions.

In accordance with one embodiment, a semiconductor device is formed on a substrate having a first device region of a first conductivity type and a second device region of a second, different conductivity type. A plurality of first gate electrodes are formed on the first device region and one or more second gate electrodes are formed on the second device region. Active regions of the substrate are formed in regions of the substrate defined by sidewalls of the first and second gate electrodes. A first dopant, of the first conductivity type, is selectively implanted into regions of the substrate adjacent the sidewalls of the first gate electrodes. Portions of the substrate adjacent one or more sidewalls of selected first and second gate electrodes are selectively masked while leaving exposed regions in the substrate in each of the first and second device regions and a second dopant, of the second conductivity type, is implanted into the exposed regions in the first and the second device regions. A third dopant, of the second conductivity type, is also implanted into the active regions adjacent the sidewalls of each of the first and the second gate electrodes.

In one embodiment, the first device region is an n-channel device region and the second device region is a p-channel device region. In the fabrication process of this type of device, in accordance with one embodiment, the first dopant is an n-type dopant implanted at a dosage ranging between 1E15 and 5E15 dopants/cm$^2$, the second dopant is a p-type dopant implanted at a dosage ranging between 0.8E15 and 3E15 dopants/cm$^2$ and, the third dopant is a p-type dopant implanted at a dosage ranging from 0.5E14 and 5E14 dopants/cm$^2$.

In accordance with another embodiment of the invention, a semiconductor device is formed on a substrate having a first device region of a first conductivity type and a second device region of a second, different conductivity type. A plurality of gate electrodes are formed on the first device region and one or more gate electrodes on the second device region. A mask is formed to cover the substrate adjacent the gate electrodes on the second device region while exposing the substrate adjacent the gate electrodes on the first device region. A first dopant, of the first conductivity type, implanted into the exposed portions of the substrate. A mask is also formed to cover the substrate adjacent a first side of a particular gate electrode on the first device region while exposing the substrate adjacent a second side of the particular gate electrode. This mask also covers the substrate adjacent at least one side of a gate electrode on the second device region. A second dopant, of the second conductivity type, is implanted into the exposed portions of the substrate. The substrate adjacent the gate electrodes on the first device region and the substrate adjacent the gate electrodes on the second device region is also exposed and a third dopant, of the second conductivity type, is implanted into the exposed portions of the substrate.

In accordance with still another embodiment of the invention, a semiconductor device disposed on a substrate having a first device region of a first conductivity type and a second device region of a second, different conductivity type is provided. The device includes a plurality of first transistors disposed in the first device region and connected in series. Each of the first transistors have a corresponding source and drain region. The device further includes a plurality of second transistors disposed in the second device region and connected in series. Each of the second transistors have a corresponding source and drain. The source of a particular one of the second transistors disposed in the second device region at a position closest to the first device region has a conductivity characteristic which is different than its drain. In one particular embodiment, the drain has a lower conductivity than the source.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
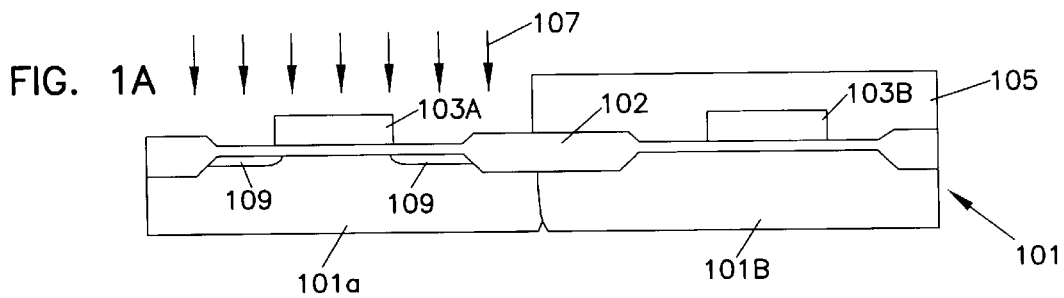
FIGS. 1A–1E illustrate a conventional fabrication process for a CMOS LDD device.
Figure 1B:
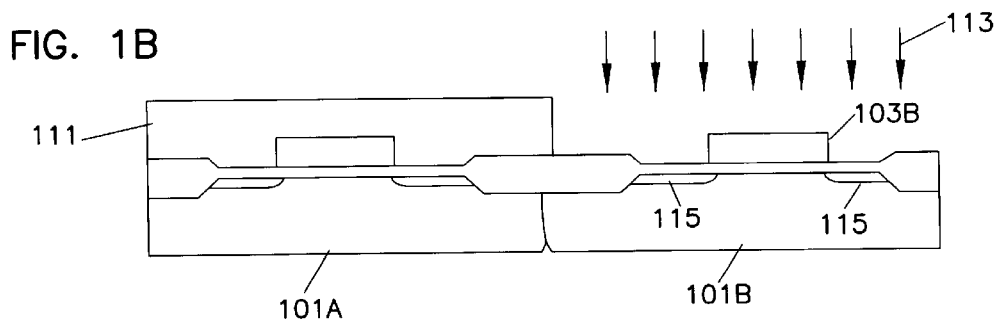
Figure 1C:
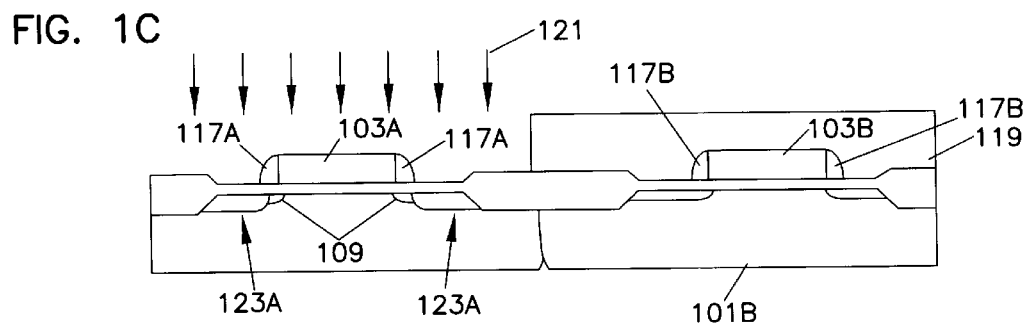
Figure 1D:
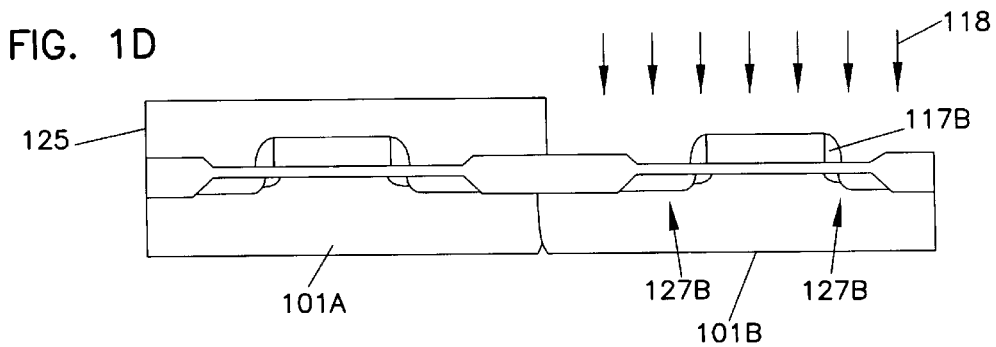
Figure 1E:
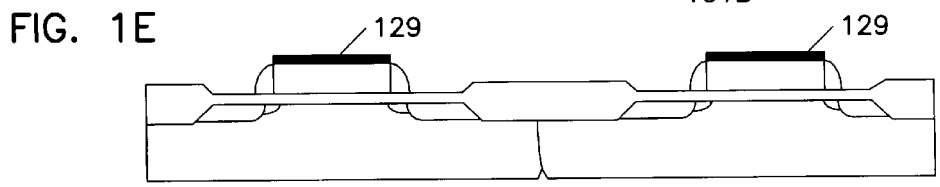

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE EMBODIMENTS

The present invention is applicable to a number of semiconductor devices. The present invention is believed to be particularly suited to fabrication of complementary metal-oxide-semiconductor (CMOS) devices in which a dopant is implanted into selected regions on both the n-channel and p-channel regions. The invention is also believed to be particularly advantageous when manufacturing short-channel devices in which the source and drain regions of a particular transistor are non-symmetrically doped. While the present invention is not limited to such devices, an appreciation of various aspects of the invention will be gained through a discussion of various fabrication processes and device characteristics in connection with the examples provided below.

A number of examples are provided below in which certain transistors are non-symmetrically doped (i.e., source and drain regions have different conductivity characteristics). Non-symmetrical doping may be used to fabricate high performance transistors in a manner which exploits relatively low operating voltages (e.g., 3 volts and less). More particularly, the voltage drop across such transistors can be exploited in a manner which permits new fabrication techniques to be used and which permits the fabrication of new, high-performance devices. Various advantages and uses of selective, non-symmetrical doping are described more fully in a copending patent application, filed by the present inventors and commonly assigned to the assignee of the present application, serial number 08/771,181, filed Dec. 20, 1996, and entitled "Semiconductor Device Having a Group of High Performance Transistors and Method of Manufacture Thereof," the contents of which are incorporated herein by reference.

Figure 2A:
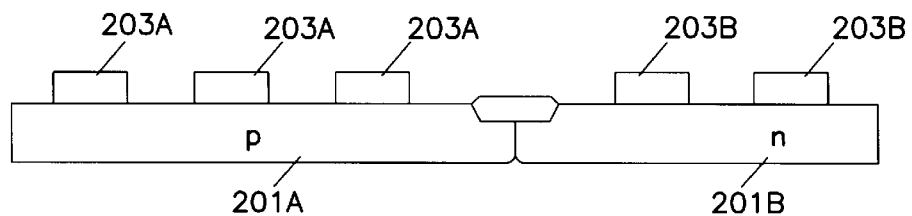
FIGS. 2A–2E illustrate a fabrication process in accordance with an embodiment of the present invention.

An exemplary fabrication process in accordance with an embodiment of the invention will now be described in connection with FIGS. 2A–2E. As illustrated in FIG. 2A, a number of gate electrodes 203A and 203B are formed on a substrate having two device regions 201A and 201B. In the illustrated example, the two device regions 201A and 201B respectively correspond to n-channel and p-channel device regions. It will be appreciated, however, that the particular type of regions used in the specific example are for illustration only and are not intended to limit the invention. The gate electrodes 203A and 203B may be formed using well-known techniques. Typically, the gate electrodes are isolated from the substrate by a thin gate oxide layer (not shown).

Figure 2B:
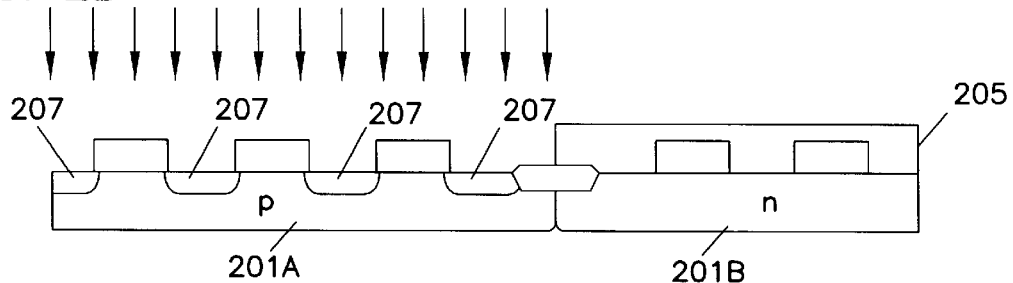
Figure 2C:
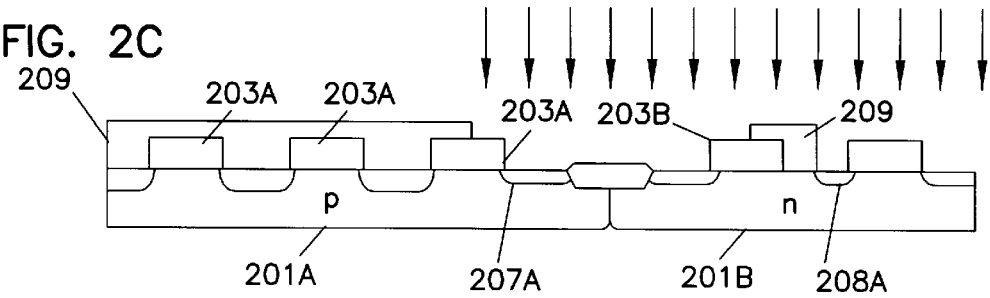
Figure 2D:
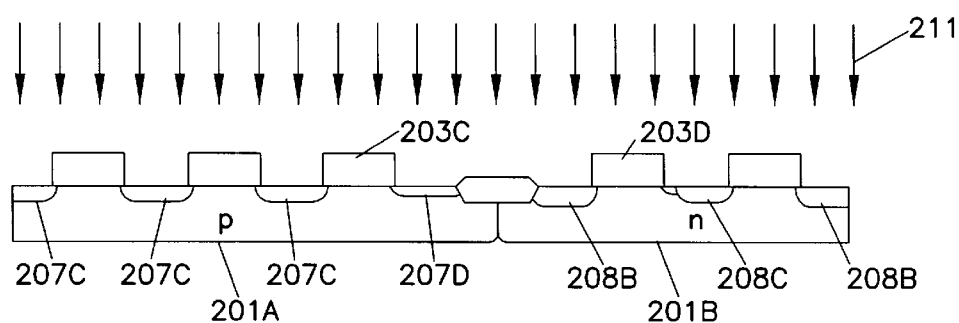
Figure 2E:
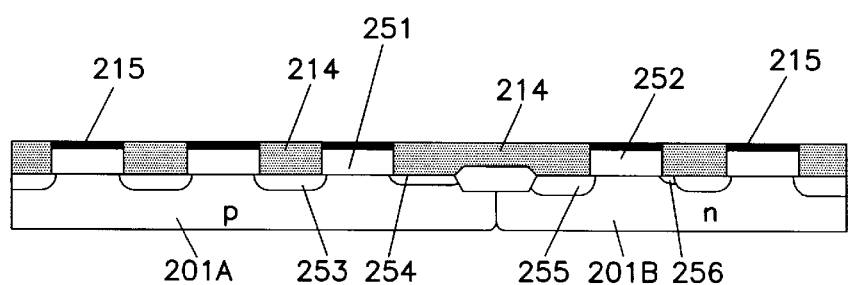

A mask layer 205 is formed to cover the gate electrodes 203B on the p-channel device region 201B. Using the mask 205, an n-type dopant is selectively implanted into the n-channel device region 201A. A relatively high dose of the n-type dopant is used to form heavily doped active regions in exposed portions of the substrate in the n-channel device region 201A, as illustrated in FIG. 2B. This implant may be carried out, for example, at dosages of 1E15 to 5E15 dopants/cm$^2$. The mask 205 is removed and a second mask 209 is formed to selectively cover portions of the n-channel and p-channel device regions 201A and 201B. In the illustrated embodiment, the gate electrode nearest the p-channel device region 201B is masked such that only one side of the gate electrode is covered. The exposed side of this gate electrode 203A is that closest to the p-channel device region 201B. The mask layer 209 also covers one side of the gate electrode 203B in the p-channel device region 201B which lies closest to the n-channel device region 201A. The exposed side of this gate electrode 201B is that closest to the n-channel device region 201A. Using this mask 209, a relatively high dose p-type dopant is implanted into the exposed regions of the substrate. The dosages may range, for example, from 0.8E15 to 3E15 dopants/cm$^2$. As will be appreciated, the heavy implant of the p-type dopant will lower the conductivity of the exposed active region 207A of the n-channel device region 201A. As a result, the active region 207A has a lower conductivity as illustrated in FIG. 2C.

Following the implantation of the p-type dopant, the mask layer 209 may be removed, and a relatively low dose, blanket implant of a p-type dopant is performed over the entire substrate. The dosage may range, for example, from 0.5E14 to 5E14 atoms/cm$^2$. As will be appreciated, the blanket implant tends to further decrease the conductivity of the n-type active regions 207C and 207D. At the same time, the conductivity of the p-type active regions 208B and 208C are increased. As will be appreciated, the two gate electrodes 203C and 203D which are adjacent to the boundary between the device regions 201A and 201B have non-symmetrically doped source and drain regions. The non-symmetrical doped regions, as described above, exploit the fact that voltage drops across transistors corresponding to these gate electrodes will be sufficient to allow higher dopant concentrations to be used in the formation of the other transistors. It will be appreciated that the fabrication process steps illustrated in FIGS. 2A–2D require only two masking and three implantation steps. Moreover, it will be appreciated that the active regions can be formed without the use of spacers. In this manner, higher performance active regions may be formed adjacent those gate electrodes which are further away from the high voltage source. Furthermore, as compared to the conventional LDD fabrication process, a significant reduction in fabrication process time and expense is achieved.

Following the blanket p-type dopant implant, an oxide layer 214 may be deposited over the resultant structure and then polished to expose the surface of the gate electrodes. A silicide layer can then be formed on the surfaces of the gate electrodes 203. The oxide 214 isolates the gate electrodes and the silicide layer 215 facilitates interconnection. As will be appreciated, spacers are not required in the formation of the structure illustrated in FIG. 2E.

In accordance with one aspect of the invention, the transistors manufactured using the above process may represent a group of series connected transistors. In this embodiment, as well as various embodiments described below, an n-channel transistor 251 and a p-channel transistor 252 are respectively formed closest to the opposite conductivity type device regions. These transistors 251 and 252 each have non-symmetrically doped source and drain regions. In the illustrated example, the active regions 253 and 254 of the n-channel transistor 251 farthest from and closest to the p-channel device region 201B represent, for example, the source and drain regions, respectively. Similarly, the active regions 255 and 256 of the p-channel transistor 252 farthest from and closest to the n-channel device region 201A represent, for example, the drain and source regions, respectively. In this manner, in the illustrated embodiment, the non-symmetrically doped transistor among a group of serially connected transistors is the transistor (251 in the n-channel device region 201A and 252 in the p-channel device region 201B) which is closest in the group to the high voltage source to permit exploitation of a corresponding voltage drop across that transistor.

FIGS. 3A through 3E illustrate another example embodiment of the present invention. In this embodiment, a plurality of gate electrodes 303A and 303B are respectively formed on n-channel and p-channel device regions 301A and 301B. The gate electrodes 303B formed on the p-channel device region are selectively masked with a mask layer 305 and a high dose n-type dopant 306 is implanted into exposed regions of the substrate to form active regions 307 in the n-channel device region 301A.

Following the implantation of the high dose n-type dopant, the mask layer 305 is removed and a blanket, p-type dopant 309 is implanted into the n-channel and p-channel device regions 301A and 301B. The dosage of the p-type implant is relatively low and is used to selectively form a PLDD region in the p-channel device region 301B as described below. The p-type dopant 309 further serves to lower the conductivity of the heavily doped n-type active regions 307 in the n-channel device region 301A to reduce the conductivity thereof. The resultant structure accordingly includes lightly doped p-type regions 311A formed in the p-channel device region 301B and n-type doped active regions 307A formed in the n-channel device region 301A.

Figure 3A:
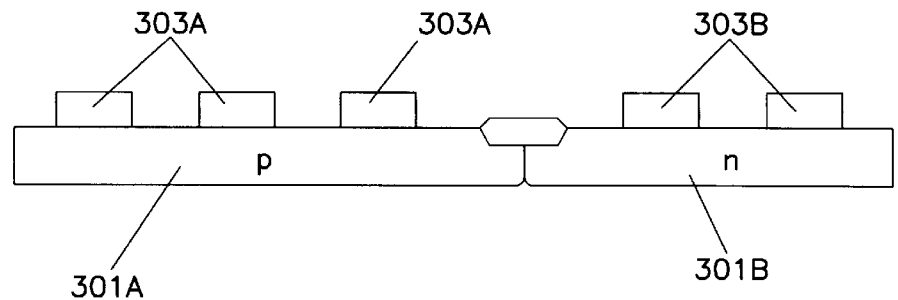
FIGS. 3A–3E illustrate another fabrication process in accordance with another embodiment of the invention.
Figure 3B:
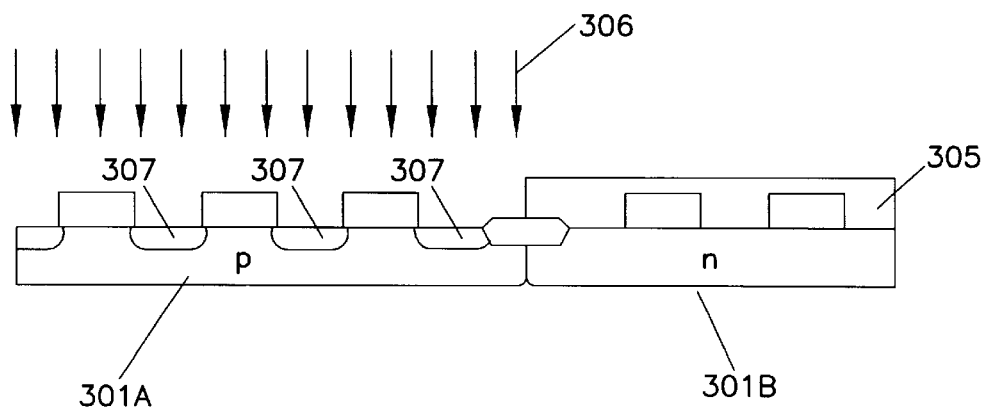
Figure 3C:
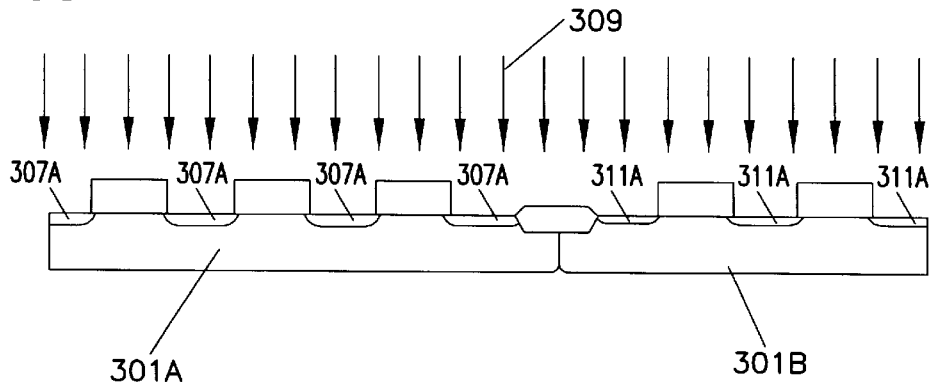
Figure 3D:
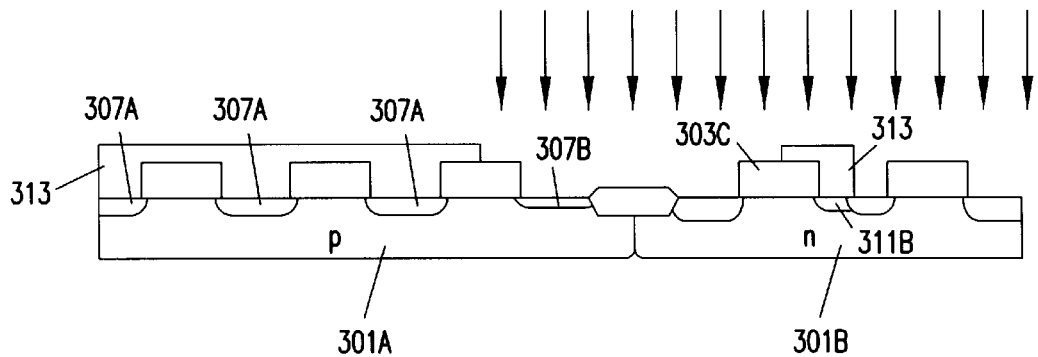
Figure 3E:
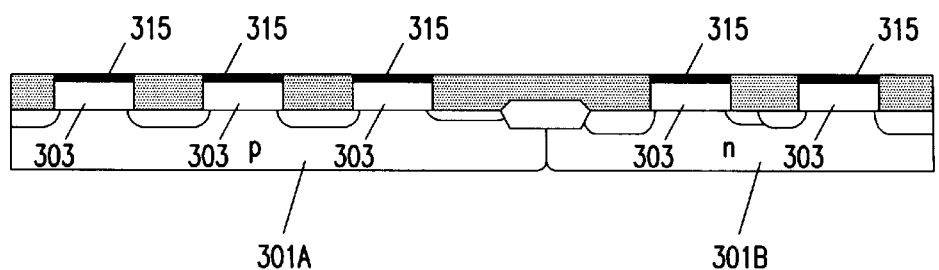

Following the blanket implant of the p-type dopant, a mask layer 313 is formed over each of the active regions disposed in the n-channel device region 301A except that active region 307B formed closest to the p-channel device region 301B. The mask layer 313 also covers a portion of the active region adjacent a sidewall of the gate electrode 303C which is closest to the n-channel device region. The covered portion lies adjacent the side of the gate electrode 303C which is further away from the n-channel device region 301A as illustrated in FIG. 3D. Using the mask, relatively high dose of a p-type dopant is implanted into the exposed active regions. In this manner, the conductivity of the exposed active region 307B in the n-channel device region 301A is the further reduced to form a lower conductivity region. Additionally, the conductivity of the masked active region 311B is less than the exposed active regions in the p-channel device resulting from the additional p-type doping received by the exposed active regions in the p-channel device region 301B.

In the manner described above in connection with FIGS. 2A through 2E, an oxide layer may be formed over the resultant structure, etched and polished to expose surfaces of the gate electrodes 303. A silicide layer 315 may then be formed on the surfaces of the gate electrodes. Subsequent to formation of the silicide layer, using known techniques, processing may be performed to form contacts to the active regions formed within the p-channel and n-channel device regions 301A and 301B.

Figure 4A:
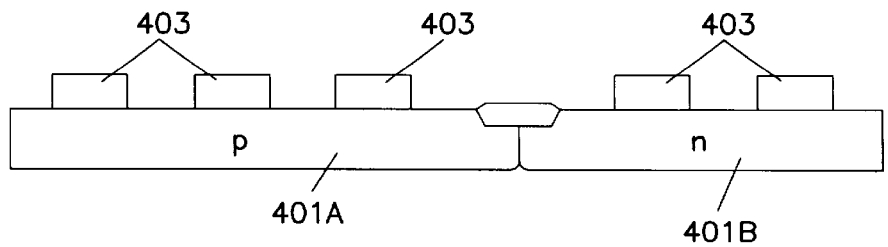
FIGS. 4A–4F illustrate still another fabrication process in accordance with another embodiment of the invention.
Figure 4B:
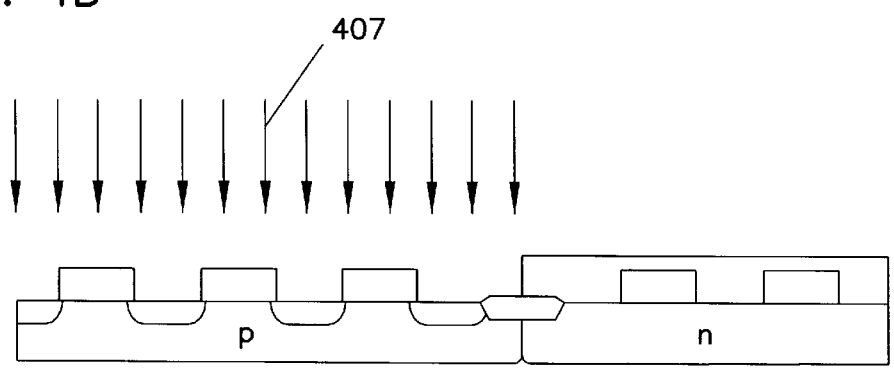
Figure 4C:
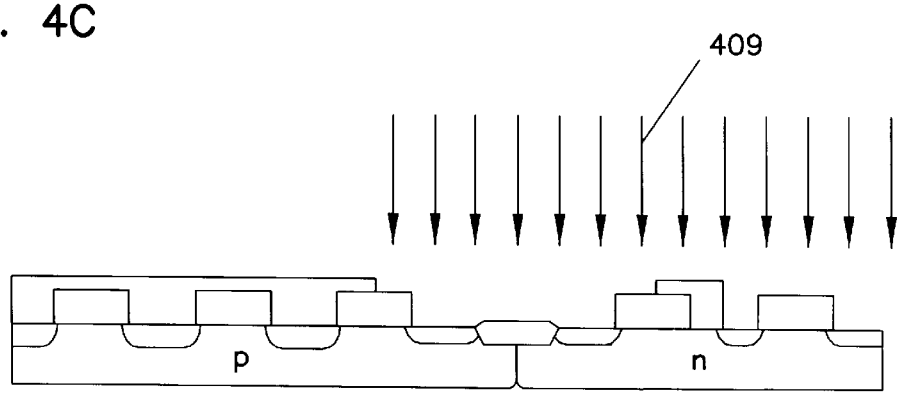

A fabrication process in accordance with still another embodiment of the invention is illustrated in FIGS. 4A through 4F. In this process, a plurality of gate electrodes 403 are formed on n-channel and p-channel device regions 401A and 401B. A relatively high dose of an n-type dopant 407 and a high dose of a p-type dopant 409 are respectively implanted into the substrate as illustrated in FIGS. 4B and 4C. These masking and implantation steps may be performed, for example, in the manner described above in connection with FIGS. 2A through 2C.

Figure 4D:
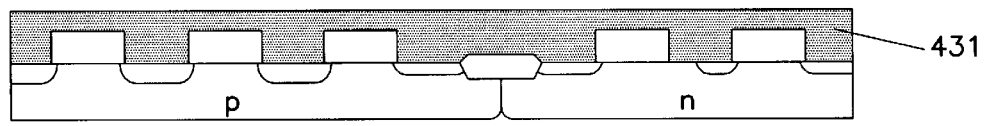
Figure 4E:
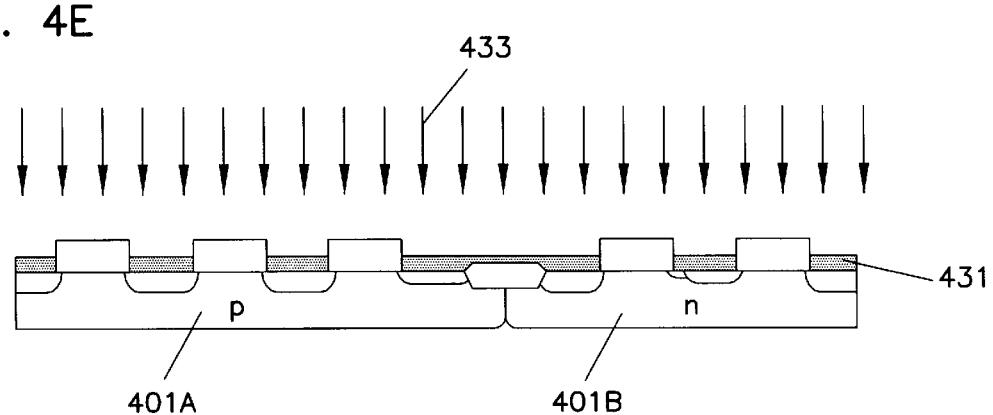
Figure 4F:
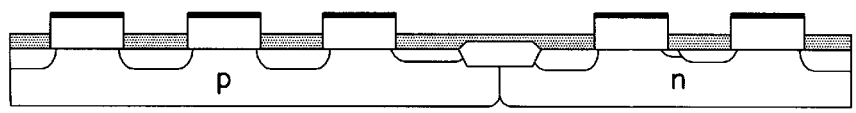

Following the p-type dopant 409 high dose implant, a relatively thick oxide layer 431 is formed over the resultant structure as illustrated in FIG. 4D. The oxide layer 431 is subsequently etched to a desired thickness and a blanket p-type dopant 433 is implanted and diffused through the oxide layer 431 and into the active regions formed in the substrate. In this manner, the conductivity of the active regions in the n-channel device region 401A are reduced while the conductivity of the active regions in the p-channel device region 401B are increased. Following implant of the blanket p-type dopant 433, a silicide may be formed on surfaces of the gate electrodes. As will be appreciated, the dosages and implant energy used to implant through the oxide layer 431 will be adjusted based on the thickness of the oxide layer 431 in accordance with known parameters. In general, the dosages used correspond roughly to the exemplary dosages provided in connection with the embodiment illustrated in FIGS. 2A through 2E.

As noted above, the present invention is applicable to the fabrication of a number of different devices. For example, the number of gate electrodes may vary depending on the circuit being fabricated. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor device disposed on a substrate having a first device region of a first conductivity type and a second device region of a second conductivity type different than the first conductivity type, the semiconductor device comprising:

a plurality of first transistors disposed in the first device region and connected in series, each of the first transistors having a corresponding source and drain; and a plurality of second transistors disposed in the second device region and connected in series, each of the second transistors having a corresponding source and drain, the source of a particular one of the second transistors disposed at a position closest to the first device region having a conductivity characteristic different from its drain.

2. A semiconductor device as recited 1, wherein the drain of the particular one of the second transistors has a lower conductivity than the source.

3. A semiconductor device as recited 2, wherein the second device region comprises an n-channel device region.

4. A semiconductor device as recited 3, wherein the drain of a particular one of the first transistors has a lower conductivity than the source.

5. A semiconductor device as recited 1, wherein the source of a particular one of the first transistors which is disposed closest to the second device region has a conductivity characteristic different from the drain of the particular one of the first transistors.

6. A semiconductor device as recited 1, wherein the second device region comprises an n-channel device region.

7. A semiconductor device as recited 1, wherein the drain of the particular one of the second transistors has a lower conductivity that the source.

8. A semiconductor device disposed on a substrate having an n-channel device region and a p-channel device region, comprising:

a plurality of first transistors disposed in the p-channel device region and connected in series, each of the first transistors having a corresponding source and drain; and a plurality of second transistors disposed in the n-channel region and connected in series, each of the second transistors having a corresponding source and drain;

wherein the source of a particular one of the second transistors disposed closest to the p-channel device region has a conductivity characteristic different from its drain; and wherein the source of a particular one of the first transistors disposed closest to the n-channel device region has a conductivity characteristic different from its drain.

9. A semiconductor device as recited 8, wherein the drain of the particular one of the second transistors has a lower conductivity than the source of the particular one of the second transistors.

10. A semiconductor device as recited 9, wherein the source and drain of the particular one of the second transistors have substantially similar concentrations of an n-type dopant and the drain of the particular one of the second transistors has a higher concentration of a p-type dopant than the source.

11. A semiconductor device as recited 8, wherein the drain of the particular one of the first transistors has a lower conductivity than the source of the particular one of the first transistors.

12. A semiconductor device as recited 11, wherein the source of the particular one of the first transistors has a higher concentration of a p-type dopant than the drain of the particular one of the first transistors.

13. A semiconductor device as recited 8, wherein a source and drain of a second one of the second transistors have similar conductivity characteristics.

14. A semiconductor device as recited 13, wherein the particular one of the second transistors and the second one of the second transistors share a common active region.

15. A semiconductor device as recited 8, wherein the drain of the particular one of the second transistors is disposed closer to the p-channel device region than the source of the particular one of the second transistors.

16. A semiconductor device as recited 8, wherein the source of the particular one of the first transistors is disposed closer to the n-channel device region than the drain of the particular one of the first transistors.

17. A semiconductor device as recited 16, wherein the drain of the particular one of the second transistors is disposed closer to the p-channel device region than the source of the particular one of the second transistors.

\* \* \* \* \*

UNITED STATES PATENT AND TRADEMARK OFFICE
CERTIFICATE OF CORRECTION

PATENT NO. : 5,952,696
DATED : January 30, 1997
INVENTOR(S) : Gardner et al.

It is certified that error appears in the above-identified patent and that said Letters Patent is hereby corrected as shown below:

Column 1,
Line 57, "used to controls" should read -- used to control --.
Line 61, "the type of dopants" should read -- on the type of dopants --.

Column 2,
Line 5, "type of device-would" should read -- type of device would --.

Column 3,
Line 2, "are typically" should read -- is typically --.
Line 13, "on two devices regions" should read -- on two device regions --.

Column 4,
Line 9, "transistors have a corresponding" should read -- transistors has a corresponding --.
Line 13, "have a corresponding source" should read -- has a corresponding source --.

Column 5,
Line 12-3, "serial number 08/771,181" should read 08/771,131 --.

UNITED STATES PATENT AND TRADEMARK OFFICE
CERTIFICATE OF CORRECTION

PATENT NO.    : 5,952,696
DATED         : January 30, 1997
INVENTOR(S)   : Gardner et al.

It is certified that error appears in the above-identified patent and that said Letters Patent is hereby corrected as shown below:

<u>Column 7,</u>
Line 12, "Using the mask, relatively" should read -- Using the mask, a relatively --.
Line 34, "are formed" should read -- is formed --.
Line 49, "are reduced" should read -- is reduced --.
Line 51, "are increased" should read -- is increased --.

Signed and Sealed this

Seventh Day of January, 2003

JAMES E. ROGAN
*Director of the United States Patent and Trademark Office*